United States Patent [19]

Hashimoto

[11] Patent Number: 5,241,505
[45] Date of Patent: Aug. 31, 1993

[54] READ ONLY MEMORY DEVICE WITH HIGH SPEED DATA OUTPUT UNIT

[75] Inventor: Kiyokazu Hashimoto, Tokyo, Japan

[73] Assignee: NEC Corporation, Tokyo, Japan

[21] Appl. No.: 667,991

[22] Filed: Mar. 12, 1991

[30] Foreign Application Priority Data

Mar. 12, 1990 [JP] Japan .................................. 2-61406

[51] Int. Cl.$^5$ ........................ G11C 11/34; G11C 7/00
[52] U.S. Cl. ..................................... 365/210; 365/205
[58] Field of Search ................... 365/207, 208, 189.07,
365/189.09, 203, 205, 210; 307/530, 358, 359

[56] References Cited

U.S. PATENT DOCUMENTS 4,459,497 7/1984 Kuo et al. ....................... 365/208 X
5,142,495 8/1992 Canepa ........................... 365/210 X

FOREIGN PATENT DOCUMENTS 0296489 11/1989 Japan .

*Primary Examiner*—Robert J. Pascal
*Assistant Examiner*—Seung Ham
*Attorney, Agent, or Firm*—Sughrue, Mion, Zinn, Macpeak & Seas

[57] ABSTRACT

A read only memory device comprises a memory cell array, a selector unit interconnecting one of the memory cells to an input node of a sense amplifier unit for producing a read-out signal at a read-out node, a reference unit for producing a reference signal with an intermediate voltage level between voltage levels corresponding to logic "1" bit and logic "0" bit, and a voltage comparator coupled to the sense amplifier unit and the reference unit, wherein the sense amplifier unit has a load transistor continuously supplying current to the read-out node, a transfer gate transistor for interconnecting the input node and the read-out node under the control of an inverting amplifier coupled to the input node, and a charging transistor for providing an auxiliary current path to the read-out node upon rapid decay in voltage level at the read-out node, thereby causing the read-out signal to quickly become stable.

9 Claims, 5 Drawing Sheets

READ ONLY MEMORY DEVICE WITH HIGH SPEED DATA OUTPUT UNIT

FIELD OF THE INVENTION

This invention relates to a non-volatile semiconductor memory device and, more particularly, to a data output unit incorporated in a read only memory device.

DESCRIPTION OF THE RELATED ART

Referring first to FIG. 1 of the drawings, a prior art read only memory device largely comprises a memory cell unit 1, a sense amplifier unit 2 coupled to the memory cell unit 1, a reference unit 3 for producing a reference voltage level Vref, and a comparator unit 4. The prior art read only memory device selectively enters an active phase and a standby phase, and a phase signal RD indicative of either active or standby phase of read-out operation is fed from a controlling unit (not shown) to the sense amplifier unit 2. In this prior art read only memory device, the phase signal RD goes down to a low voltage level in the active phase of operation, and goes up to a high voltage level in the standby phase of read-out operation.

The memory cell unit 1 has a memory cell matrix 1a, and the memory cell matrix 1a is constituted by a plurality of memory cell blocks MB1 to MBn each implemented by eight memory cells M111 to M118 or M1n1 to M1n8 coupled in series. The memory cells thus coupled in series are referred to as "NAND memory cell structure". A plurality of row address lines Xm1, Xm2 and Xm8 are coupled to the rows of the memory cells M111 to M1n8, and one of the row address lines Xm1 to Xm8 is driven to the low voltage level for selecting one of the rows of the memory cells. The memory cells M111 to M1n8 fixedly store data bits of logic "1" and "0" levels. If a memory cell stores a data bit of logic "1" level, the memory cell is of the enhancement type. However, a memory cell for a data bit of logic "0" level is implemented by the depletion type field effect transistor.

The memory cell unit 1 further has a selector circuit 1b, and the selector circuit 1b is fabricated from a plurality of n-channel enhancement type field effect transistors Qb1 to Qbn coupled to the memory cell blocks MB1 to MBn, respectively. The n-channel enhancement type field effect transistors Qb1 to Qbn are respectively coupled to block address lines Xb1 to Xbn, and one of the block address lines Xb1 to Xbn is driven to the high voltage level. A common drain node SD is shared by all of the n-channel enhancement type field effect transistors Qb1 to Qbn, and, for this reason, a substantial amount of parasitic capacitance is coupled to the common drain node SD. In fact, the parasitic capacitance coupled to the common drain node SD is estimated at several PF.

Though not shown in FIG. 1, the prior art read only memory device has other memory cell matrices, and a column selector 1c is coupled to the memory cell matrices. The column selector 1c is fabricated from a plurality of n-channel enhancement type field effect transistors, and one of the n-channel enhancement type field effect transistors Qy1 is shown in association with the memory cell matrix 1a. The n-channel enhancement type field effect transistors incorporated in the column selector 1c are respectively coupled to column address lines, and the n-channel enhancement type field effect transistor Qy1 is coupled to the column address line Y1. For selection of one of the memory cell matrices, one of the column address lines goes up to the high voltage level. The n-channel enhancement type field effect transistors of the column selector 1c share the common drain node SC3, and the parasitic capacitance at the common drain node SC3 is as large as several PF.

The sense amplifier unit 2 is coupled between a source of positive voltage level Vcc and the common drain node SC3, and comprises an inverting amplifier circuit 2a. The inverting amplifier circuit 2a increases the magnitude of an input voltage level Vin at the common drain node SC3, and the input voltage level Vin at the common drain node SC3 is determined by the data bit stored in a memory cell selected with the row, block and column address lines. The inverting amplifier circuit 2a is fabricated from two p-channel enhancement type field effect transistors Qs1 and Qs2 coupled in series between the source of power voltage level Vcc and an output node Ns1, and two n-channel enhancement type field effect transistors Qs3 and Qs4 coupled in parallel between the output node Ns1 and a ground node. If the phase signal RD remains in the high voltage level indicative of the standby phase, the p-channel enhancement type field effect transistor Qs1 is turned off, and the n-channel enhancement type field effect transistor Qs4 is turned on. The output node Ns1 is grounded through the n-channel enhancement type field effect transistor Qs4 and blocked from the source of power voltage level Vcc. This inactivates the inverting amplifier circuit 2a. On the other hand, if the phase signal RD goes down to the low voltage level, the p-channel enhancement type field effect transistor Qs1 turns on, and the n-channel enhancement type field effect transistor Qs4 turns off. Then, a current path is provided from the source of power voltage level Vcc to the series combination of the p-channel enhancement type field effect transistor Qs2 and the n-channel enhancement type field effect transistor Qs3. Since the n-channel enhancement type field effect transistor Qs4 is turned off, the current is discharged through the series combination of the p-channel enhancement type field effect transistor Qs2 and the n-channel enhancement type field effect transistor Qs3 to the ground node. The current driving capabilities of the field effect transistors Qs2 and Qs3 are varied with the input voltage level Vin at the common drain node SC3, and the p-channel enhancement type field effect transistor Qs2 and the n-channel enhancement type field effect transistor Qs3 complementarily behave. Then, the input voltage level Vin at the common drain node SC3 is increased so as to produce the output voltage level Vout at the output node Ns1 in an inverting manner. The sense amplifier unit 2 further comprises a precharging transistor Qs5 of the n-channel enhancement type, a transfer gate transistor Qs6 of the n-channel enhancement type, and a load transistor Qs7 of the p-channel enhancement type. Since the precharging transistor Qs5 and the transfer gate transistor Qs6 are gated by the output node Ns1, an output node Ns2 is blocked from the source of power voltage level Vcc as well as from the common drain node SC3 in the standby phase. The load transistor Qs7 regulates the read-out voltage level Vread at the output node Ns2 to a predetermined range when a memory cell storing a data bit of logic "0" is accessed. Namely, when the memory cell storing the data bit of logic "0" is accessed, the depletion type field effect transistor is turned on, and current passes through the load transistor Qs7, the column selector 1c, the selector circuit 1b and the memory cell to the ground node. Then, the read-out voltage level Vread at the output node Ns2 is determined by a ratio between the current driving capability of the load transistor Qs7 and the amount of current ION passing through the memory cell. The precharging transistor Qs5 and the transfer gate transistor Qs6 are used for charging the common drain node SC3. Namely, the output node Ns1 goes up to the high voltage level as long as the common drain node SC3 is recovered to the low voltage level. The high voltage level at the output node Ns1 allows the precharging transistor Qs5 and the transfer gate transistor Qs6 to turn on, and the common drain node SC3 is charged through the precharging transistor Qs5 and the transfer gate transistor Qs6.

The reference unit 3 comprises a series of dummy memory cells Mr1, Mr2 and Mr8, and the dummy memory cells Mr1, Mr2 and Mr8 have respective gate electrodes width to length ratios of which are approximately equal to those of the memory cells M1n1 to M1n8, respectively The width to length ratio is hereinbelow abbreviated as "W/L" ratio. The dummy memory cells Mr1 to Mr8 are coupled to a series of n-channel enhancement type field effect transistors Qr1 and Qr2, and the W/L ratios are approximately equal to those of the n-channel enhancement type field effect transistors Qy1 and Qbn, respectively. Thus, the string of field effect transistors Qy1, Qbn, M1n1, M1n2 and M1n8 is equivalent to that of the field effect transistors Qr1, Qr2, Mr1, Mr2 and Mr8, and, for this reason, the amount of the current ION is approximately equal to that of the current passing through the string of the field effect transistors Qr1 to Mr8. The reference unit 3 further comprises an inverting amplifier circuit 3a consisting of field effect transistors Qr3, Qr4, Qr5 and Qr6 arranged as similar to the inverting amplifier circuit 2a, and the W/L ratio of each component transistor of the inverting amplifier circuit 3a is equal to that of the corresponding component transistor of the inverting amplifier circuit 2a. The inverting amplifier circuit 3a is also responsive to the phase signal RD, and a precharging transistor Qr7, a transfer gate transistor Qr8 and a load transistor Qr9 are coupled between a node Nr1 and the string of the field effect transistors Qr1 to Mr8. The W/L ratio of each field effect transistor Qr7, Qr8 or Qr9 is approximately equal to that of the corresponding field effect transistor Qs5, Qs6 or Qs7, and only one difference is an n-channel type field effect transistor Qr10 with the W/L ratio approximately equal to that of the load transistor Qs7. Thus, two load transistors Qr9 and Qr10 are coupled in parallel between the source of power voltage level Vcc and the node Nr1, and the reference voltage level Vref is regulated at an intermediate voltage level between the read-out voltage level in the presence of a data bit of logic "0" level and the read-out voltage level in the presence of a data bit of logic "1" level.

Description is made on the behavior of the prior art read only memory device with reference to FIG. 2, and plots IV3 is representative of the input-to-output characteristics of the inverting amplifier circuit 2a of the sense amplifier unit 2. In FIG. 2, Vin(on) and Vin(off) are indicative of the input voltage level Vin at the common drain node SC3 upon access to a memory cell storing a data bit of logic "0" level and the input voltage level Vin upon access to a memory cell storing a data bit of logic "1" level, respectively. Vout(on) and Vout(off) respectively stand for the output voltage level Vout at the output node Ns1 in the presence of the input voltage level Vin(on) and the output voltage level Vout in the presence of the input voltage level Vin(off) As described hereinbelow, the inverting amplifier circuit 3a of the reference unit 3 is equivalent to the inverting amplifier circuit 2a, and, therefore, Vin(on), Vin(off), Vout(on) and Vout(off) also stand for the input voltage level at the common drain node Nr2 and for the output voltage level at the output node Nr3 of the inverting amplifier circuit 3a.

For the sake of simplicity, it is assumed that all of the n-channel enhancement type field effect transistors have a threshold voltage level Vtn and that all of the p-channel enhancement type field effect transistors are regulated at a threshold voltage level Vtp.

In order to access the memory cell M1n1 storing a data bit of logic "1" level, the row address line Xm1 goes down to the low voltage level, and other row address lines Xm2 to Xm8 remain in the high voltage level. Since the block address line Xbn and the column address line Y1 go up to the high voltage level, a conductive path is established from the common drain node SC3 through the n-channel enhancement type field effect transistors Qy1 and Qbn to the memory cell block Mbn. However, the other block signal lines such as Xb1 remain in the low voltage level, and no conductive path is provided for the other memory blocks. Since the memory cell M1n1 is of the enhancement type, the conductive path is blocked by the memory cell M1n1, and the voltage level at the common drain node SD and, accordingly, the common drain node SC3 is charged to the high voltage level. In other words, the input voltage level Vin(off) takes place at the common drain node SC3. The input voltage level Vin(off) causes the inverting amplifier circuit 2a to pull down the output voltage level Vout. If output node Ns1 goes down below the output voltage level Vout(off), the transfer gate transistor Qs6 turns off to cut off the conductive path. The output voltage level Vout(off) is given as follows:

$$Vout(off) = Vin(off) + Vtn \qquad \text{(Equation 1)}$$

Upon turning to the off-state, the voltage level at the output node Ns2 is increased and reaches the read-out voltage level Vread(off) represented as $$Vread(off) = Vcc - |Vtp| \qquad \text{(Equation 2)}$$

From Equations 1 and 2, it is understood that K3 of FIG. 2 is the balancing point between the common drain node SC3 and the output node Ns1.

The memory cell M111 stores a data bit of logic "0" level and is, accordingly, implemented by the n-channel depletion type field effect transistor. The row address line Xm1 remains in the low voltage level, and other row address lines Xm2 to Xm8 continue to be in the high voltage level. The column address line Y1 also remains in the high voltage level. However, the block address line Xb1 goes up to the high voltage level, and the block address line Xb1 is recovered to the low voltage level. In this situation, the memory cell M111 turns on, and a conductive path is established from the common drain node SC3 through the memory cell M111 to the ground node. This results in that the common drain node SC3 is discharged, and, accordingly, the current ION flows through the memory cell M111. The common drain node SC3 goes down to the low voltage level, and the input voltage level Vin(on) takes place at the common drain node SC3. The input voltage level Vin(on) allows the output node Ns1 to go up to the output voltage level Vout(on) given as $$Vout(on) = Vout(off) + dV1 \quad \text{(Equation 3)}$$

where dV1 is an increment from the output voltage level Vout(off) for allowing the current ION to flow. The output node Ns2 slightly goes down to the read-out voltage level Vread(on)

$$Vread(on) = Vcc - |Vtp| - dV2 \quad \text{(Equation 4)}$$

where dV2 is a decrement due to the current ION passing through the load transistor Qs7. The common drain node SC3 is balanced with the output node Ns2 at L3 of FIG. 2.

As described hereinbelow, the reference voltage level Vref is adjusted to an intermediate voltage level between the read-out voltage levels Vread(on) and Vread(off).

The above description is focused on the sense amplifier unit 2 only, but the interrelated circuit behaviors between the sense amplifier unit 2 and the reference unit 3 are described hereinbelow with coreference to FIGS. 2 and 3 on the assumption that a memory cell storing a data bit of logic "0" level is accessed.

In the Standby Phase

While the prior art read only memory device is in the standby phase, the phase signal RD remains in the high voltage level and allows the p-channel enhancement type field effect transistor Qs1 and the n-channel enhancement type field effect transistor Qs4 to turn off and on, respectively. The output node Ns1 is grounded and causes the precharging transistor Qs5 and the transfer gate transistor Qs6 to turn off. In this situation, the common drain node SC3 is cut from the source of power voltage level Vcc and discharged to the ground voltage level. Since the load transistor Qs7 supplies current to the output node Ns2, the voltage level Vst at the output node Ns2 is given by Equation 5 as follows:

$$Vst = Vcc - |Vtp| \quad \text{(Equation 5)}$$

Similarly, the node Nr3 and Nr2 are discharged to the ground voltage level, and the reference voltage level Vref is as high as the voltage level Vst at the output node Ns2. The comparator unit 4 produces an output signal SK4, and the output signal SK4 is assumed to be Vcc.

Time Period Between Times t1 and t21

If the prior art read only memory device enters the active phase at time t1, the phase signal RD goes down to the low voltage level, and the p-channel enhancement type field effect transistors Qs1 and Qs2 concurrently turn on to supply current to the output node Ns1. The current thus supplied to the output node Ns1 causes the output node Ns1 to rapidly go up to the high voltage level, and the precharging transistor Qs5 and the transfer gate transistor Qs6 concurrently turn on to establish conductive path from the source of power voltage level Vcc to the common drain node SC3. With the current passing through the transistors Qs5 and Qs6, and, accordingly, electric charges gradually charge up the common drain node SC3 and, accordingly, the common drain node SD. However, the output node Ns2 is decreased in voltage level. When the common drain node SC3 reaches a voltage level Vin(min) of FIG. 2, the output voltage level Vout goes down and traces plots IV3 in accordance with the input-to-output characteristics of the inverting amplifier circuit 2. The decrease in voltage level at the output node Ns1 results in decrease of current driving capability of the precharging transistor Qs5, and the output node Ns2 rises. When a difference between the output nodes Ns1 and Ns2 becomes smaller than the threshold voltage Vtn, the precharging transistor Qs5 turns off, and, for this reason, the output node Ns2 is charged through the load transistor Qs7 only. Since the accessed memory cell stores the data bit of logic "0" level, the output node Ns1 is expected to balance with the common drain node SC3 at L3. However, a time delay is introduced by the inverting amplifier circuit 2a, because the increment at the common drain node SC3 is fed back through the inverting amplifier circuit 2a to the output node Ns1 as a decrement of voltage level. When the output node Ns1 reaches the output voltage level Vout(on), the time delay thus introduced allows the common drain node SC3 to be excessively charged to an excess voltage level Vin(over), and the output node Ns1 is finally balanced with the common drain node SC3 at point M3. Accordingly, the output node Ns1 further goes down to a voltage level Vout(over). Such an undesirable phenomenon is hereinbelow called as "over-precharging".

Time Period Between Time t21 and Time t22

Since the output node Ns1 is lower than the output voltage level Vout(on), the transfer gate transistor Qs6 hardly turns on in spite of the accessed memory cell storing the data bit of logic "0" level, and the output node Ns2 is further charged with current through the load transistor Qs7. The output node Ns2 reaches the limited voltage level ( Vcc−|Vtp|). The accessed memory cell allows current to pass therethrough, and, accordingly, the voltage level Vin is decreased. When the common drain node SC3 reaches the input voltage level Vin(off), the output node Ns1 is regulated to the output voltage level Vout(off) as indicated by point K3 of FIG. 2.

Time Period Between Times t22 and t23

The common drain node SC3 further goes down to the Vin(on), and the output node Ns1 reaches the output voltage level Vout(on) so as to balance with the input voltage level Vin(on) at point L3. Then, the transfer gate transistor Qs6 turns on, and the output node Ns2 is regulated to the read-out voltage level Vread(on).

If a memory cell stores a data bit of logic "0" level, the current ION passing through the NAND memory cell structure is estimated at 10 micro-ampere. For this reason, after the over precharging, a long time period is consumed for discharging excess electric charges accumulated in the common drain nodes SD and SC3, and the time period is prolonged for a larger memory cell block. If the total capacitance ($C_{SC3} + C_{SD}$) of 10 PF is, by way of example, coupled to the common drain nodes SD and SC3, the time period $ts_{dis}$ is calculated by Equation 6 on the assumption that a difference voltage dV3 of 0.1 volt takes place between the input voltage level Vin(on) and the excess voltage level Vin(over).

$$t_{Sdis} = (C_{SC3} + C_{SD}) \times dV3/I_{ON} \quad \text{(Equation 6)}$$
$$= (10 \times 10^{-12}) \times 0.1/10 \times 10^{-6}$$
$$= 100 \text{ (nanosecond)}$$

The reference unit 3 behaves in a similar manner to the sense amplifier unit 2, however, the total parasitic capacitance Cref coupled to the nodes Nr3 and Nr4 is smaller than the total capacitance ($C_{SC3}+C_{SD}$). Since the parasitic capacitance is estimated at 1 PF, the time period $tr_{dis}$ for discharging the excess electric charges is given by Equation 7 on the same assumption as the sense amplifier unit 2.

$$tr_{dis} = Cref \times dV3/I_{ON} \quad \text{(Equation 7)}$$
$$= (1 \times 10^{-12}) \times 0.1/10 \times 10^{-6}$$
$$= 10 \text{ (nanosecond)}$$

As will be understood from Equations 6 and 7, the reference unit 3 is recovered from the over precharging at higher speed than the sense amplifier unit 2. Since the comparator unit 4 increases the difference in voltage level between the read-out voltage level Vread and the reference voltage level Vref, the output signal SK4 kaleidoscopically swings the voltage level thereof Namely, upon the change of the phase signal RD from the high voltage level to the low voltage level, the common drain nodes SD and SC3 are over-precharged. Although a memory cell storing a data bit of logic "0" is accessed, the read-out voltage level Vread temporarily exceeds the reference voltage level Vref, and the comparator unit 4 shifts the output signal SK4 from the high voltage level to the low voltage level. However, the electric charges accumulated in the common drain nodes SD and SC3 are discharged through the accessed memory cell, and, accordingly, the input voltage level Vin at the common drain node SC3 goes down to the voltage level Vin(on), then the read-out voltage level Vread(on) becomes lower than the reference voltage level Vref(on). With the read-out voltage level Vread(on) lower than the reference voltage level Vref(on), the comparator unit 4 shifts the output signal SK4 from the low voltage level to the high voltage level, and the true output signal SK4 corresponding to the data bit of "0" is produced by the comparator unit 4.

Thus, the prior art read only memory device delivers the invalid data bit for a while, and, thereafter, the valid data bit is supplied to an external device. For this reason, the prior art read only memory device has a drawback in access speed.

SUMMARY OF THE INVENTION

It is therefore an important object of the present invention to provide a read only memory device which is improved in access speed.

To accomplish these objects, the present invention proposes to allow a charging transistor to turn on to provide an auxiliary current path to a read-out node upon accumulating common drain nodes.

In accordance with the present invention, there is provided a read only memory device fabricated on a semiconductor substrate, comprising: a) a charging transistor responsive to a charging signal for providing a current path between a first source of voltage level and a read-out node; b) a first load transistor coupled between the first source of voltage level and the read-out node and continuously supplying current to the read-out node; c) a transfer gate transistor responsive to a controlling signal for providing a current path between the read-out node and an input node; d) a plurality of memory blocks each having a series combination of a plurality of memory cells coupled at one end thereof to a second source of voltage level different in voltage level from the first source of voltage level, the memory cells storing data bits each being of either first or second logic level, a plurality of address lines being associated with the plurality of memory cells; e) selector means coupled to the other ends of the memory blocks and allowing one of the memory cells to be coupled to the input node in cooperation with the plurality of address lines; f) a sense amplifier unit responsive to a phase signal for producing the charging signal and the controlling signal; g) a reference unit responsive to the phase signal for producing a reference signal with an intermediate voltage level between voltage levels corresponding to the first and second logic levels; and h) a voltage comparator coupled to the read-out node and the reference unit for producing an output voltage level indicative of the data bit stored in the aforesaid one of the memory cells, the sense amplifier unit comprising f—1) a first switching transistor proving a current path between the first source of voltage level and a current node in the presence of the phase signal, f—2) a first inverter circuit having a first threshold level and coupled to the input node for producing the charging signal at a first output node thereof in the presence of the phase signal, and f—3) a second inverter circuit having a second threshold level lower than the first threshold level and coupled to the input node for producing the controlling signal at a second output node in the co-presence of the phase signal and the charging signal

BRIEF DESCRIPTION OF THE DRAWINGS

The features and advantages of a read only memory device according to the present invention will be more clearly understood from the following description taken in conjunction with the accompanying drawings in which.

DESCRIPTION OF THE PREFERRED EMBODIMENTS

First Embodiment

Figure 4:
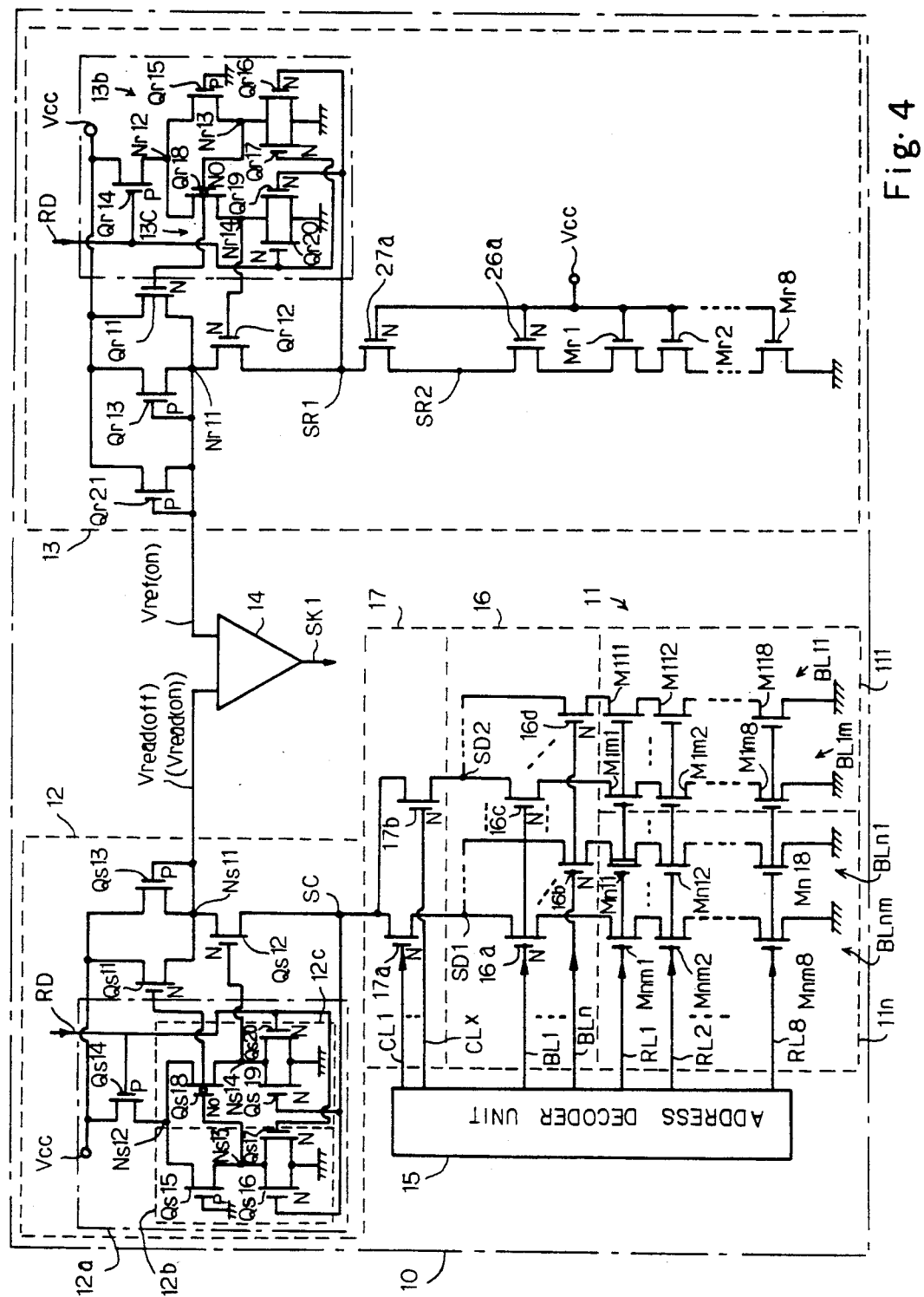
FIG. 4 is a circuit diagram showing the arrangement of a read only memory device according to the present invention.

Referring to FIG. 4 of the drawings, a read only memory device embodying the present invention largely comprises a memory cell array 11, a sense amplifier unit 12, a reference unit 13, a voltage comparator unit 14 and an address decoder unit 15 and is fabricated on a semiconductor chip 10. Although other peripheral units such as a controlling unit is incorporated in the read only memory device, the other peripheral units are not shown in FIG. 4 for the sake of simplicity.

The memory cell array 11 has a plurality of memory cell matrices 111 to 11n, and a plurality of memory cell blocks BL11 to BL1m or BLn1 to BLmn are incorporated in each of the memory cell matrices 111 to 11n. Every memory cell block BL11, BL1m, BLn1 or BLmn is implemented by a series of memory cells M111 to M118, M1m1 to M1m8, Mn11 to Mn18 or Mnm1 to Mnm8, and each memory cell is either n-channel enhancement or n-channel depletion type. The n-channel enhancement type and the n-channel depletion type are used for a data bit of logic "1" level and a data bit of logic "0" level, respectively All of the memory cell blocks BL11 to BLnm are coupled in parallel between a block selector circuit 16 and a ground node, and the block selector circuit 16 is fabricated from a plurality of transfer gate transistors 16a, 16b, 16c and 16d of the n-channel enhancement type. The transfer gate transistors 16a to 16d are coupled to the memory cell blocks BL11 to BLnm, respectively, and the block selector circuit 16 is coupled to the column selector circuit 17 having a plurality of transfer gate transistors 17a and 17b of the n-channel type. Namely, all of the transfer gate transistors associated with one of the memory cell matrices are coupled at a common drain node SD1 or SD2 with one another, and the transfer gate transistors 17a to 17b are coupled between the common drain nodes SD1 to SD2 of the transfer gate transistors 16a to 16b and 16c to 16d and a common drain node SC thereof. The address decoder unit 15 selectively drives a plurality of row address lines RL1, RL2 to RL8, a plurality of block address lines BL1 to BLn, and a plurality of column address lines CL1 to CLx, thereby allowing an external device to access a data bit memorized in one of the memory cells M111 to Mnm8.

The sense amplifier unit 12 comprises an inverting amplifier circuit 12a, a precharging transistor QS11 of the n-channel enhancement type coupled between a source of positive voltage level Vcc and an output node Ns11, a transfer gate transistor Qs12 of the n-channel enhancement type coupled between the output node Ns11 and the common drain node SC, and a load transistor of the p-channel enhancement type coupled between the source of power voltage level Vcc and the output node Ns11. In this instance, the power voltage level is about 5 volts. The transfer gate transistor Qs12 and the load transistor Qs13 behave as similar to those of the prior art read only memory device, and, for this reason, no further description is incorporated. However, the precharging transistor Qs11 is different in connection of the gate electrode from the corresponding precharging transistor Qs5 and will be hereinbelow described in detail.

The inverting amplifier circuit 12a is operative to increase an input voltage level Vin at the common drain node SC, and the input voltage level Vin depends on the data bit stored in a memory cell accessed from the outside thereof. The inverting amplifier circuit 12a according to the present invention has a first inverter 12b, a second inverter 12c and a p-channel enhancement type field effect transistor Qs14. The p-channel enhancement type field effect transistor Qs14 is responsive to a phase signal RD and provides a current path from a source of power voltage level Vcc through a common node Ns12 to the first and second inverters 12b and 12c in the presence of the phase signal of an active low level While the phase signal remains in the high level, the read only memory device is shifted to a standby phase. However, if the phase signal goes down to the low level, the read only memory device enters an active phase. The first inverter 12b comprises a p-channel enhancement type field effect transistor Qs15 coupled between the common node Ns12 and a first output node Ns13, and n-channel enhancement type field effect transistors Qs16 and Qs17 coupled in parallel between the first output node Ns13 and the ground node. The gate electrode of the p-channel enhancement type field effect transistor Qs15 is grounded, and the n-channel enhancement type field effect transistor Qs16 is coupled at the gate electrode thereof to the common drain node SC. However, the n-channel type field effect transistor Qs17 is supplied with the phase signal RD and, for this reason, couples the first output node Ns13 to the ground node in the standby phase. The second inverter 12c comprises an n-channel natural type field effect transistor Qs18 coupled between the common node Ns12 and a second output node Ns14, and n-channel enhancement type field effect transistors Qs19 and Qs20 coupled in parallel between the second output node Ns14 and the ground node. The n-channel natural type field effect transistor Qs18 is fabricated on the semiconductor substrate 10 without any channel doping, and the threshold level of the natural type field effect transistor is, therefore, dominated by the resistivity of the semiconductor substrate. In this instance, the n-channel natural type field effect transistor Qs18 has a threshold voltage level of about zero without taking any back-gate biasing effect into account. The n-channel natural type field effect transistor Qs18 is coupled at the gate electrode thereof to the first output node Ns13, and the precharging transistor Qs11 is also coupled to the first output node Ns13. Taking the back gate biasing effect into account, the threshold voltage level of the n-channel natural type field effect transistor Qs18 with respect to the voltage level of the substrate 10 is hereinbelow referred to as "threshold level Vto". However, other n-channel type field effect transistors and the p-channel enhancement type field effect transistors are assumed to have a threshold voltage level Vtn and a threshold voltage level Vtp. The threshold voltage level Vtn is adjusted to about 0.7 volts in this instance. The n-channel enhancement type field effect transistor Qs19 is coupled at the gate electrode to the common drain node SC and the phase signal RD is supplied to the gate electrode of the n-channel enhancement type field effect transistor QS20 so that the second output node Ns14 is grounded in the standby phase. The W/L ratios of the field effect transistors Qs15, Qs16, Qs17 and Qs18 are regulated in such a manner that the first inverter 12b has a threshold level higher than that of the second inverter 12c, and the advantages of the higher threshold level is described hereinafter.

The reference unit 13 comprises a sense amplifier unit similar in arrangement to the sense amplifier unit 12 except for an additional load transistor Qr21 of the p-channel enhancement type, and the sense amplifier unit has third and fourth inverters 13b and 13c. The reference unit 13 is provided for producing a reference voltage level Vref between read-out voltage levels Vread(off) and Vread(on) corresponding to logic "1"

and "0" levels as similar to the reference unit 3 of the prior art read only memory device. The corresponding component transistors of the sense amplifier unit incorporated in the reference unit 13 are designated by similar references Qr followed by the same numerals 10 to 20, and corresponding nodes are also denoted by similar references Nr followed by the same numerals 11 to 14. The reference unit 13 further comprises transfer gate transistors 26a and 27a coupled between a reference node SR1 and a series of dummy memory cells Mr1, Mr2 and Mr8, and the gate electrodes of the transfer gate transistors 26a and 27a and the dummy memory cells Mr1 to Mr8 are coupled to the source of power voltage level Vcc. The drain node of the transfer gate transistor 26a is designated by SR2. The transfer gate transistors 26a and 27a as well as the dummy memory cells Mr1 to Mr8 behave in a similar manner to those of the prior art read only memory device.

The W/L ratio of the p-channel enhancement type field effect transistors Qr15 is equal to that of the p-channel enhancement type field effect transistor Qs15, and the n-channel enhancement type field effect transistors Qr16 to Qr20 are equal in the W/L ratio to those of the n-channel enhancement type field effect transistors Qs16 to Qs20. The input-to-output voltage characteristics of the third inverter 13b are dominated by the W/L ratio of the p-channel enhancement type field effect transistor Qr15 and the W/L ratio of the n-channel enhancement type field effect transistor Qr16 and, are therefore, substantially identical with the first inverter 12b. Similarly, the input-to-output voltage characteristics of the fourth inverter 13c are substantially identical the second inverter 12c. The third inverter 13b is higher in threshold level than the fourth inverter 13c as similar to the first and second inverters 12b and 12c.

Figure 5:
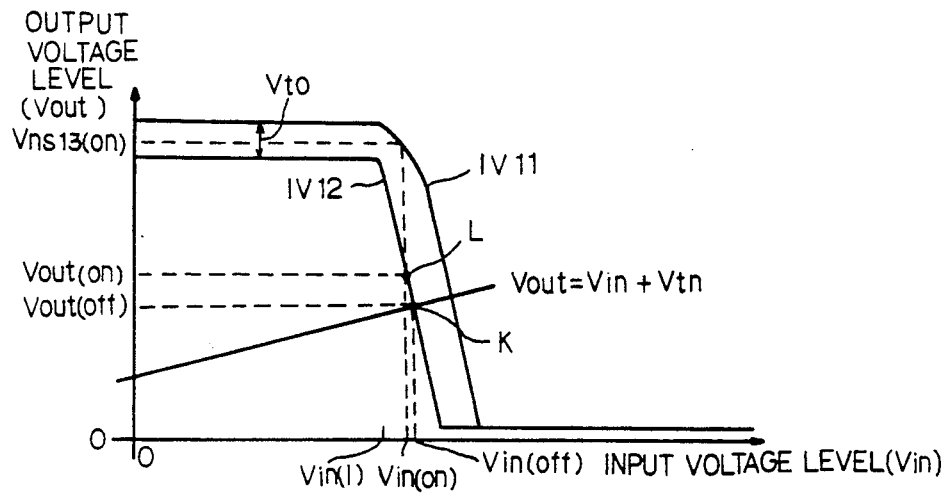
FIG. 5 is a graph showing the input-to-output voltage characteristics of inverters incorporated in the read only memory device shown in FIG. 4.
Figure 6:
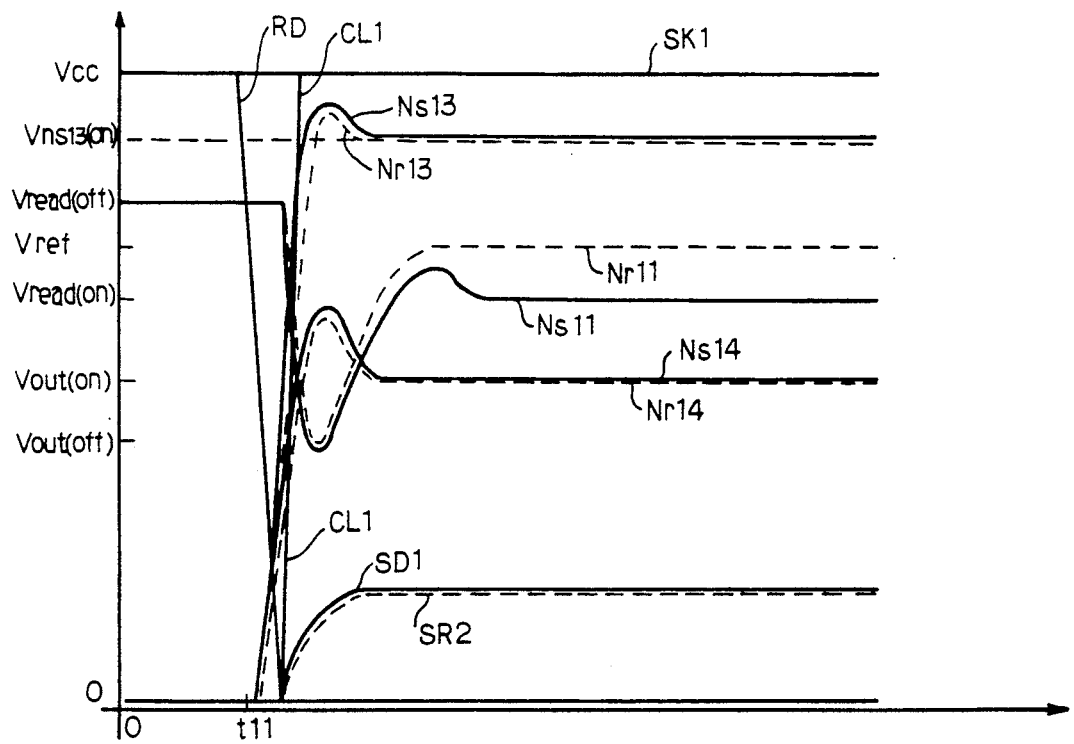
FIG. 6 is a graph showing the voltage levels at essential nodes shown in FIG. 4.

Description is hereinbelow made on the behavior of the read only memory device according to the present invention with reference to FIGS. 5 and 6 on the assumption that a memory cell storing a data bit of logic "0" is accessed. In FIG. 5, plots IV11 stand for the input-to-output voltage characteristics of the first inverter 12b and, accordingly, of the third inverter 13b, and the input-to-output voltage characteristics of the second and fourth inverters 12c and 13c are represented by plots IV12. Vin(on) and Vin(out) stand for the input voltage levels Vin at the common drain node SC upon access to a data bit of logic "0" and a data bit of logic "1". Vout(on) and Vout(off) are representative of the output voltage levels Vout at the second output node Ns14 when a data bit of logic "0" and a data bit of logic "1" are respectively, accessed. Vns13(on) is indicative of the voltage level at the first output node Ns13 upon access to a data bit of logic "0". Since the third and fourth inverters 13b and 13c are substantially identical in the input-to-output voltage characteristics with the first and second inverters 12b and 12c, the voltage levels at the output nodes Nr13 and Nr14 are approximately equal to the voltage levels Vns13(on) and Vout(on), respectively. The voltage level at the node SR1 is approximately equal to the input voltage level Vin(on). As will be understood from FIG. 5, the first and third inverters 12b and 13b are higher in threshold level than the second and fourth inverters 12c and 13c.

Standby Mode

While the read only memory device remains in the standby phase of operation, the phase signal RD is in the high level or the power voltage level, and the first and second output nodes Ns13 and Ns14 are grounded through the n-channel enhancement type field effect transistors Qs17 and Qs20 in the on-state. With the ground voltage level at the second output node Ns14, the transfer gate transistor Qs12 turns off, and the common drain node SC is as low as the ground voltage level. Since current is supplied through the load transistor Qs13, the voltage level at the node Ns11 is given as (Vcc − |Vtp|) where Vtp is the threshold voltage level of the load transistor Qs13. Similarly, the nodes Nr13, Nr14 and SR1 are as low as the ground voltage level, and the node Nr11 is balanced at (Vcc − |Vtp|). The voltage comparator 14 produces an output signal SK1 of about power voltage level Vcc. The behavior of the voltage comparator 14 is similar to that of the prior art device, and no further description is hereinbelow incorporated.

Active Mode

Figure 1:
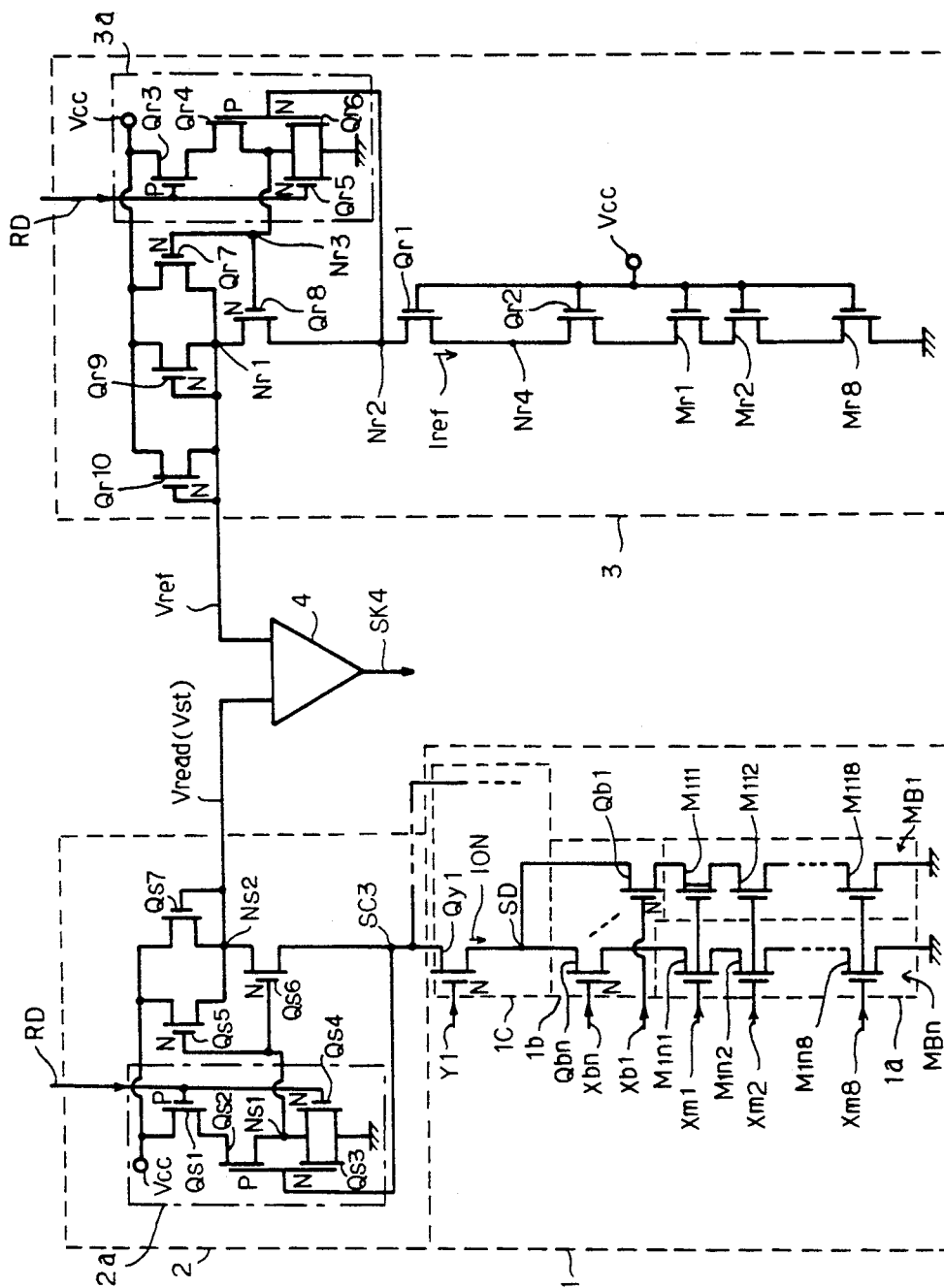
FIG. 1 is a block diagram showing the arrangement of a prior art read only memory device.
Figure 2:
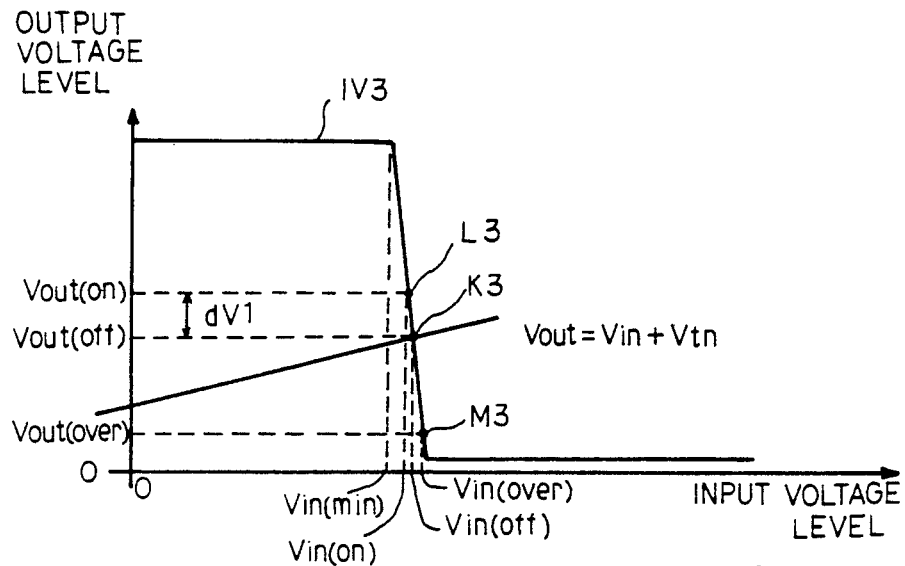
FIG. 2 is a graph showing the input-to-output voltage characteristics of the inverting amplifier circuit incorporated in the prior art read only memory device.
Figure 3:
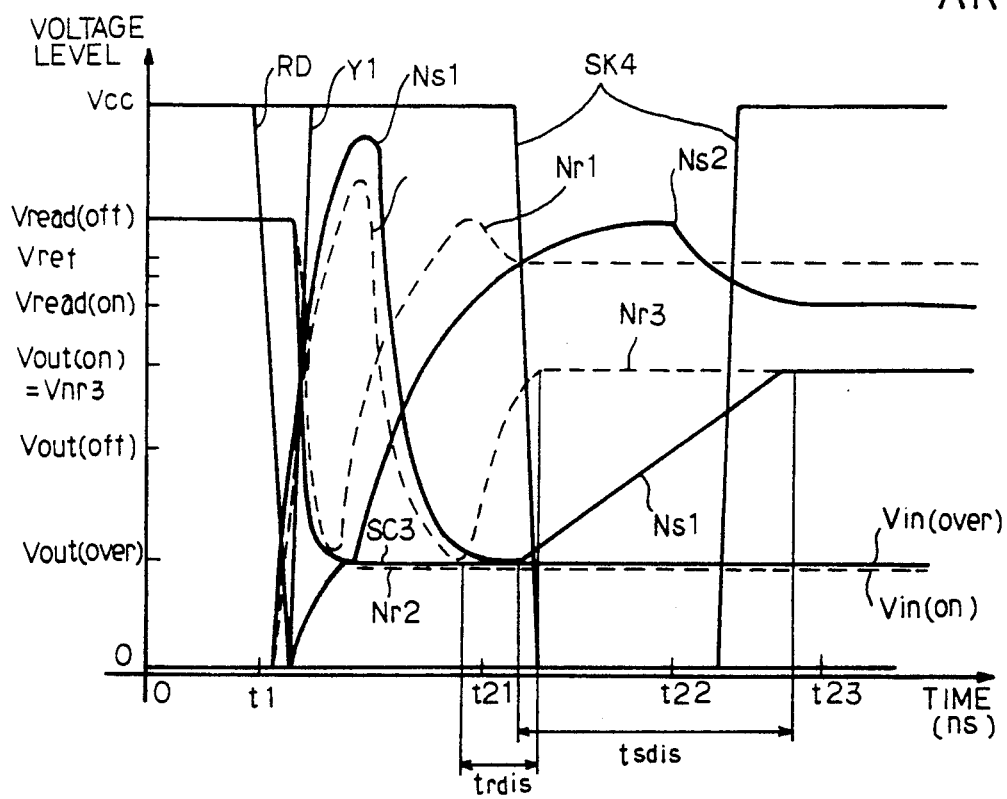
FIG. 3 is a graph showing the voltage levels at essential nodes of the prior art read only memory device.

If the phase signal RD goes down to the active low level at time t11, the p-channel enhancement type field effect transistor Qs14 turns on, and the n-channel enhancement type field effect transistors Qs17 and Qs20 turn off. Current is supplied from the source of power voltage level Vcc through the p-channel enhancement type field effect transistors Qs14 and Qs15 to the first output node Ns13, and the first output node Ns13 rapidly goes up from the ground voltage level. When the voltage level at the first output node Ns13 exceeds the threshold level Vto, the n-channel natural type field effect transistor Qs18 turns on to supply current to the second output node Ns14. When the second output node Ns14 exceeds the threshold voltage level Vtn of the transfer gate transistor Qs12, the transfer gate transistor Qs12 turns on to supply current from the node Ns11 to the common drain node SC. The transfer gate transistor 17a is assumed to turn on with the column address line CL1 of the high voltage level, and the current is further supplied to the common drain node SD. The node Ns11 is temporarily decayed from the voltage level (Vcc − |Vtp|) due to the current used for accumulation of the common drain nodes SC and SD1. If the input voltage level Vin reaches Vin(I) of FIG. 5, the common drain node SC1 and the second output node Ns14 change the voltage levels, tracing plots IV12. Since the first inverter 12b is higher in threshold level than the second inverter 12c, the second inverter 12c firstly decreases the output voltage level Vout, and the first inverter 12b keeps the voltage level at the node Ns13 high for a while. Namely, when the output voltage level Vout reaches Vout(on), the node Ns13 still remains at Vns13(on), and the precharging transistor Qs11 continues to remain in the on-state. As described hereinbefore, the node Ns11 is decayed from (Vcc − |Vtp|) due to the current used for accumulating the common drain nodes SD1 and SC. When the node Ns11 reaches a certain voltage level lower than the power voltage level Vcc by the threshold level Vtn of the precharging transistor Qs11, the precharging transistor Qs11 turns on to supply current to the node Ns11 and, accordingly, the common drain nodes SD1 and SC. For this reason, only a small amount of voltage drop takes place at the node Ns11, and this preferable recovery is clearly readable from plots Ns11 of FIG. 6 in comparison with plots Ns1 of FIG. 3. The read-out voltage level Vread(on) is regulated within a shorter time period than that of the prior art read only memory device.

The reference unit 13 behaves in a similar manner to the sense amplifier unit 12. When the phase signal RD is shifted from the high level to the low level, the nodes Nr13 and Nr14 go up from the ground voltage level, and the transfer gate transistor Qr12 turns on to charge the common drain nodes SR1 and SR2. Even though the voltage level at the node Nr14 fluctuates, the node Nr13 remains in the vicinity of the power voltage level, and the voltage level at the node Nr11 is not seriously decayed from the voltage level (Vcc−|Vtp|). In other words, no serious overprecharging takes place at the node SR1. With the readout voltage level Vread(on) and the reference voltage level Vref(on), the voltage comparator unit 14 quickly produces the output signal SK1 indicative of the data bit of logic "0".

The n-channel natural type field effect transistor Qs18 is supplied with the voltage level at the first output node Ns13, and the output voltage level Vout cannot exceed (Vcc−Vto). For example, if the threshold level Vto is adjusted to about 0.5 volt, the second output node Ns14 is peaked at about 4.5 volts. This results in that the transfer gate transistor Qs12 does not excessively drive the. The smaller current driving capability is conducive to a faster read-out operation, because the common drain nodes SD1 and SC are not excessively charged from the transfer gate transistor Qs12.

In this instance, the charging transistor Qs11 and the transfer gate transistor Qs12 are gated by the first and second output nodes Ns13 and Ns14, respectively, and the capacitance coupled to the second output node Ns14 is, accordingly, smaller than that of the output node Ns1. The small amount of the capacitance coupled to the second output node Ns14 can be quickly discharged, and the second inverter 12c promptly closes the transfer gate transistor Qs12. The second inverter 12c surely balances the second output node Ns14 at point L and, accordingly, regulates the node Ns11 to the voltage level Vread(on) indicative of the data bit of logic "0" level. The prior art read only memory device swings the read-out voltage level Vread to Vread(off) and, then, recovers it to Vread(on). However, the read only memory device according to the present invention never charges the node Ns11 to Vread(off) as will be seen from FIG. 6, and, for this reason, the voltage comparator unit 14 does not temporarily produce the output signal indicative of a data bit of logic "1" level. In other words, the second inverter 12c prevents the common drain node SC from any serious over-precharging, and, for this reason, the sense amplifier circuit 12 according to the present invention behaves faster than the inverter circuit 2a of the prior art read only memory device.

As will be understood from the foregoing description, the second output node Ns14 and the node Nr14 are quickly balanced with the common drain node SC and the node SR1 at the balancing point L through the restriction of the serious over-precharging phenomenon, and the read-out voltage level Vread never exceeds the reference voltage level Vref. This results in the stable output signal SK1 indicative of the data bit of logic "0" level, and no invalid output signal SK1 is produced. As a result, the read only memory device is improved in the access speed.

In the first embodiment, common drain node SC serves as an input node, and the voltage levels at the first and second output nodes Ns13 and Ns14 provide a charging signal and a controlling signal, respectively.

Second Embodiment

Figure 7:
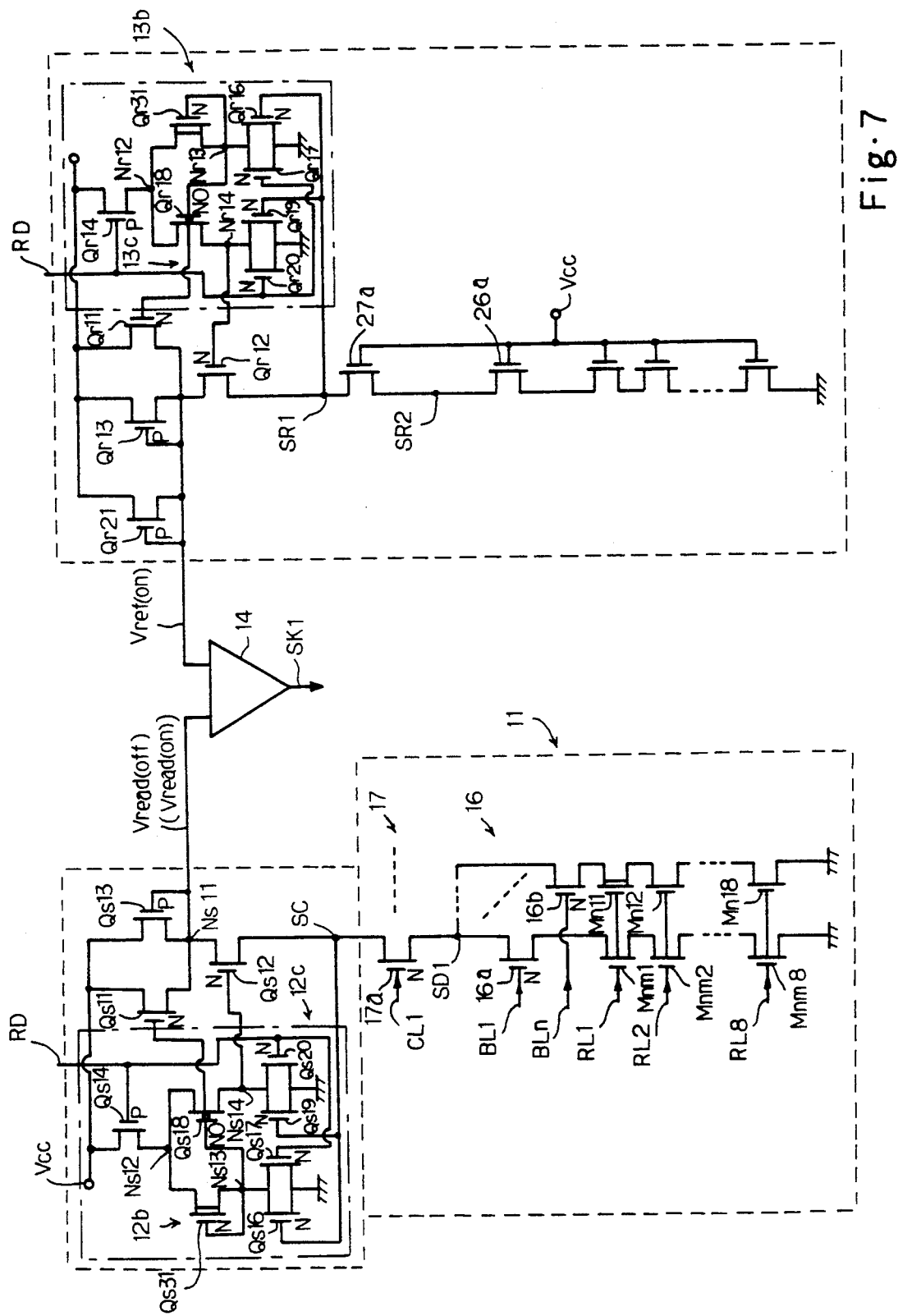
FIG. 7 is a block diagram showing the arrangement of another read only memory device according to the present invention.

Turning to FIG. 7 of the drawings, another read only memory device embodying the present invention is illustrated. Most of the components and nodes of the second embodiment correspond to those of the first embodiment, and, for this reason, the corresponding components and parts are designated by the same references used in FIG. 4 without any detailed description. In the second embodiment, the p-channel enhancement type field effect transistors Qs15 and Qr15 are replaced with n-channel depletion type field effect transistors Qs31 and Qr31, respectively. The first inverter 12b is higher in threshold level than the second inverter 12c by adjusting the W/L ratios of the n-channel depletion type field effect transistor Qs31 and the n-channel enhancement type field effect transistor Qs16. Similarly, the W/L ratios of the field effect transistors Qr31 and Qr16, and the threshold level of the third inverter 13b is higher than that of the fourth inverter 13c. The circuit behavior and the advantages of the second embodiment are similar to those of the first embodiment, and no further description is incorporated hereinbelow for the sake of simplicity.

Although particular embodiments of the present invention have been shown and described, it will be obvious to those skilled in the art that various changes and modifications may be made without departing from the spirit and scope of the present invention. For example, the n-channel natural type field effect transistor Qs18 has the threshold level Vto in both embodiments. However, the n-channel natural type field effect transistor Qs18 may be replaced with an n-channel enhancement field effect transistor with the threshold level Vtn. In another implementation, the p-channel enhancement type field effect transistor Qs15 may have a gate electrode coupled to the common drain node SC. The present invention is applicable to an electrically programmable read only memory device as well as to an electrically erasable and programmable read only memory device.

What is claimed is:

1. A read only memory device fabricated on a semiconductor substrate, comprising:
    a) a charging transistor responsive to a charging signal for providing a current path between a first source of voltage level and a read-out node;
    b) a first load transistor coupled between said first source of voltage level and said read-out node and continuously supplying current to said read-out node;
    c) a transfer gate transistor responsive to a controlling signal for providing a current path between said readout node and an input node;
    d) a plurality of memory blocks each having a series combination of a plurality of memory cells coupled at one end thereof to a second source of voltage level different in voltage level from said first source of voltage level, said memory cells storing data bits each being of either first or second logic level, a plurality of address lines being associated with said plurality of memory cells;
    e) selector means coupled to the other ends of said memory blocks and allowing one of said memory cells to be coupled to said input node in cooperation with said plurality of address lines;

f) a sense amplifier unit responsive to a phase signal for producing said charging signal and said controlling signal;

g) a reference unit responsive to said phase signal for producing a reference signal with an intermediate voltage level between voltage levels corresponding to said first and second logic levels; and h) a voltage comparator coupled to said read-out node and said reference unit for producing an output voltage level indicative of said data bit stored in said one of said memory cells, said sense amplifier unit comprising f—1) a first switching transistor providing a current path between said first source of voltage level and a current node in the presence of said phase signal, f—2) a first inverter circuit coupled between said current node and said second source of voltage level, and having a first threshold level and a control node coupled to said input node for producing said charging signal at a first output node thereof in the presence of said phase signal, and f—3) a second inverter circuit coupled between said current node and said second source of voltage level, and having a second threshold level lower than said first threshold level and a control node coupled to said input node for producing said controlling signal at a second output node in the co-presence of said phase signal and said charging signal.

2. A read only memory device as set forth in claim 1, in which said first inverter circuit comprises a second load transistor of a first channel conductivity type operable in an enhancement mode, said first output node and a first inverting transistor of a second channel conductivity type operable in said enhancement mode coupled in series between said current node and said second source of voltage level, said first inverter circuit further comprising a second switching transistor of said second channel conductivity type operable in said enhancement mode and coupled in parallel to said first inverting transistor for providing a current path between said first output node and said second source of voltage level in the absence of said phase signal, said first inverting transistor having a gate electrode coupled to said input node, said charging signal being produced at said first output node.

3. A read only memory device as set forth in claim 2, in which said second inverter circuit comprises a third switching transistor of said second channel conductivity type operable in a natural mode, said second output node and a second inverting transistor of said second channel conductivity type operable in said enhancement mode coupled in series between said current node and said second source of voltage level, said second inverter circuit further comprising a fourth switching transistor of said second channel conductivity type operable in said enhancement mode and coupled in parallel to said second inverting transistor for providing a current path between said second output node and said second source of voltage level in the absence of said phase signal, said third switching transistor having a gate electrode supplied with said charging signal, said second inverting transistor having a gate electrode coupled to said input node.

4. A read only memory device as set forth in claim 3, in which each of said memory cells is formed by either enhancement or depletion type field effect transistor.

5. A read only memory device as set forth in claim 4, in which said first and second sources of voltage level produce a positive power voltage level and a ground voltage level, respectively.

6. A read only memory device as set forth in claim 1, in which said first inverter circuit comprises a second load transistor of a second channel conductivity type operable in a depletion mode, said first output node and a first inverting transistor of said second channel conductivity type operable in an enhancement mode coupled in series between said current node and said second source of voltage level, said first inverter circuit further comprising a second switching transistor of said second channel conductivity type operable in said enhancement mode and coupled in parallel to said first inverting transistor for providing a current path between a third output node and said second source of voltage level in the absence of said phase signal, said second load transistor having a gate electrode coupled to said third output node, said first inverting transistor having a gate electrode coupled to said input node, said charging signal being produced at said first output node.

7. A read only memory device as set forth in claim 6, in which said second inverter circuit comprises a third switching transistor of said second channel conductivity type operable in a natural mode, said second output node and a second inverting transistor of said second channel conductivity type operable in said enhancement mode coupled in series between said current node and said second source of voltage level, said second inverter circuit further comprising a fourth switching transistor of said second channel conductivity type operable in said enhancement mode and coupled in parallel to said second inverting transistor for providing a current path between a fourth output node and said second source of voltage level in the absence of said phase signal, said third switching transistor having a gate electrode supplied with said charging signal, said second inverting transistor having a gate electrode coupled to said input node.

8. A read only memory device as set forth in claim 1, in which said memory cells are of an electrically programmable read only memory.

9. A read only memory device as set forth in claim 1, in which said memory cells are of an electrically erasable and programmable read only memory.

* * * * *